(12) United States Patent
Lim et al.

(10) Patent No.: US 12,543,457 B2
(45) Date of Patent: Feb. 3, 2026

(54) DISPLAY DEVICE

(71) Applicant: Samsung Display Co., Ltd., Yongin-si (KR)

(72) Inventors: Dogi Lim, Asan-si (KR); Young Je Cho, Cheonan-si (KR); Jeongil Kim, Seoul (KR); Kwang-Min Lee, Pyeongtaek-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 570 days.

(21) Appl. No.: 17/992,374

(22) Filed: Nov. 22, 2022

(65) Prior Publication Data

US 2023/0320148 A1    Oct. 5, 2023

(30) Foreign Application Priority Data

Mar. 31, 2022    (KR) .................. 10-2022-0040740

(51) Int. Cl.
*H10K 59/131*  (2023.01)
*H10K 59/88*   (2023.01)

(52) U.S. Cl.
CPC ........... *H10K 59/131* (2023.02); *H10K 59/88* (2023.02)

(58) Field of Classification Search
CPC .................. H10K 59/88; H10K 59/131; G09G 2300/0413
See application file for complete search history.

(56) References Cited

U.S. PATENT DOCUMENTS

| 10,797,127 | B2 | 10/2020 | Son |
| 2022/0199649 | A1* | 6/2022 | Xu ................. H10D 86/60 |

FOREIGN PATENT DOCUMENTS

| CN | 107658294 A | * | 2/2018 | ............ H01L 21/77 |
| CN | 113161401 A | | 7/2021 | |
| CN | 110061012 B | * | 1/2022 | ........... G02F 1/1337 |
| KR | 100187721 B1 | | 6/1999 | |
| KR | 1020190079308 A | | 7/2019 | |
| KR | 1020200074728 A | | 6/2020 | |
| WO | WO-2022036910 A1 | * | 2/2022 | ....... G02F 1/136286 |

* cited by examiner

*Primary Examiner* — Xuemei Zheng
(74) *Attorney, Agent, or Firm* — CANTOR COLBURN LLP

(57) ABSTRACT

A display device includes a first data line group disposed in a fan-out area and including a plurality of first data lines extending to a display area adjacent to the fan-out area, a second data line group disposed in the fan-out area and including a plurality of second data lines extending to the display area adjacent to the fan-out area, a plurality of pixels disposed in the display area and connected to the first and second data lines, and a dummy pattern disposed in the fan-out area between the first data line group and the second data line group, where the dummy pattern is in a floating state.

18 Claims, 16 Drawing Sheets

DISPLAY DEVICE

This application claims priority to Korean Patent Application No. 10-2022-0040740, filed on Mar. 31, 2022, and all the benefits accruing therefrom under 35 U.S.C. § 19, the content of which in its entirety is herein incorporated by reference.

BACKGROUND

1. Field

Embodiments of the disclosure described herein relate to a display device.

2. Description of the Related Art

In general, electronic devices such as a smart phone, a digital camera, a laptop computer, a navigation system, a smart television, and the like that provide an image to a user include a display device for displaying the image. The display device generates the image and provides the generated image to the user via a display screen.

In general, the display device includes a display panel and a plurality of driving integrated circuits (ICs) connected to the display panel. The driving ICs may be disposed on flexible circuit boards and connected to the display panel via the flexible circuit boards.

The display panel includes a plurality of pixels for displaying the image and lines connected to the pixels. The driving ICs may be connected to the lines via the flexible circuit boards. Driving signals generated by the driving ICs are provided to the pixels via the lines, and the pixels are driven in response to the driving signals.

SUMMARY

In a manufacturing process of a display panel, a substrate on which pixels and lines connected thereto are formed may be transferred via transfer rollers. During such a transferring process, the lines may be charged based on friction between the substrate and the transfer rollers. In this case, a burnt phenomenon in which components on the substrate are damaged by static electricity caused by the charged lines may occur. Therefore, there is desired to develop a technology for preventing such a burnt phenomenon.

Embodiments of the disclosure provide a display device capable of preventing damage to components on a substrate.

According to an embodiment, a display device includes a first data line group disposed in a fan-out area and including a plurality of first data lines extending to a display area adjacent to the fan-out area, a second data line group disposed in the fan-out area and including a plurality of second data lines extending to the display area adjacent to the fan-out area, a plurality of pixels disposed in the display area and connected to the first and second data lines, and a dummy pattern disposed in the fan-out area between the first data line group and the second data line group, where the dummy pattern is in a floating state.

According to an embodiment, a display device includes a first data line group disposed in a fan-out area and including a plurality of first data lines extending to a display area adjacent to the fan-out area, a second data line group disposed in the fan-out area and including a plurality of second data lines extending to the display area adjacent to the fan-out area, a plurality of pixels disposed in the display area and connected to the first and second data lines, and a dummy pattern disposed in the fan-out area between the first data line group and the second data line group, and the dummy pattern extends parallel to a first data line adjacent to the second data line group among the first data lines and to a first second data line adjacent to the first data line group among the second data lines.

According to an embodiment, a display device includes a first data line group disposed in a fan-out area and including a plurality of first data lines extending to a display area adjacent to the fan-out area, a second data line group disposed in the fan-out area and including a plurality of second data lines extending to the display area adjacent to the fan-out area, a plurality of pixels disposed in the display area and connected to the first and second data lines, and a dummy pattern disposed in the fan-out area between the first data line group and the second data line group, where the dummy pattern is insulated from surrounding conductors and no voltage is applied to the dummy pattern.

BRIEF DESCRIPTION OF THE DRAWINGS

The above and other features of the disclosure will become apparent by describing in detail embodiments thereof with reference to the accompanying drawings.

DETAILED DESCRIPTION

Figure 1:
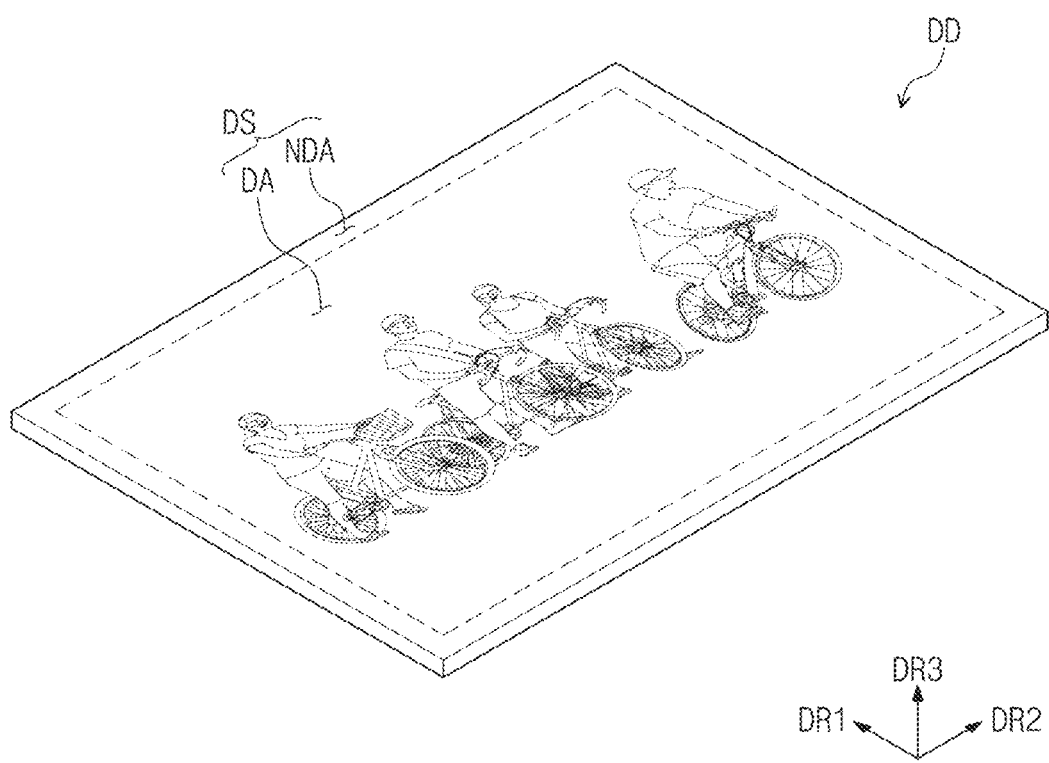
FIG. 1 is a perspective view of a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein.

Rather, these embodiments are provided so that this disclosure will be thorough and complete, and will fully convey the scope of the invention to those skilled in the art.

In the present specification, when a component (or an area, a layer, a portion, and the like) is referred to as being "on", "connected to", or "coupled to" another component, it means that the component may be directly disposed/connected/coupled on another component or a third component may be disposed between the component and another component.

Like reference numerals refer to like components. In addition, in the drawings, thicknesses, ratios, and dimensions of components are exaggerated for effective description of technical content.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In addition, terms such as "beneath", "below", "on", "above" are used to describe the relationship of the components shown in the drawings. The above terms are relative concepts, and are described with reference to directions indicated in the drawings.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

FIG. 1 is a perspective view of a display device according to an embodiment of the disclosure.

Referring to FIG. 1, an embodiment of a display device DD may have a plane defined by a first direction DR1 and a second direction DR2 crossing the first direction DR1. The display device DD may have a rectangular shape having short sides extending in the first direction DR1 and long sides extending in the second direction DR2 intersecting the first direction DR1. However, the disclosure may not be limited thereto, and the display device DD may have various shapes such as a circular shape or a polygonal shape.

Hereinafter, a direction substantially perpendicular to the plane defined by the first and second directions DR1 and DR2 is defined as a third direction DR3. Herein, the third direction DR3 may be a thickness direction of the display device DD.

A top surface of the display device DD may be defined as a display surface DS, and may be on the plane defined by the first direction DR1 and the second direction DR2. An image generated by the display device DD may be provided to a user via the display surface DS.

The display surface DS may include a display area DA and a non-display area NDA around the display area DA. The display area DA may display the image, and the non-display area NDA may not display the image. The non-display area NDA may surround the display area DA and may define a border of the display device DD printed in a predetermined color.

The display device DD may be used in large electronic devices such as a television, a monitor, or an external billboard. Alternatively, the display device DD may be used in small and medium-sized electronic devices such as a personal computer, a laptop computer, a personal digital terminal, a vehicle navigation, a game console, a smart phone, a tablet, or a camera. However, these are presented only as an embodiment, and the display device DD may be used in other electronic devices without departing from the teachings herein.

Figure 2:
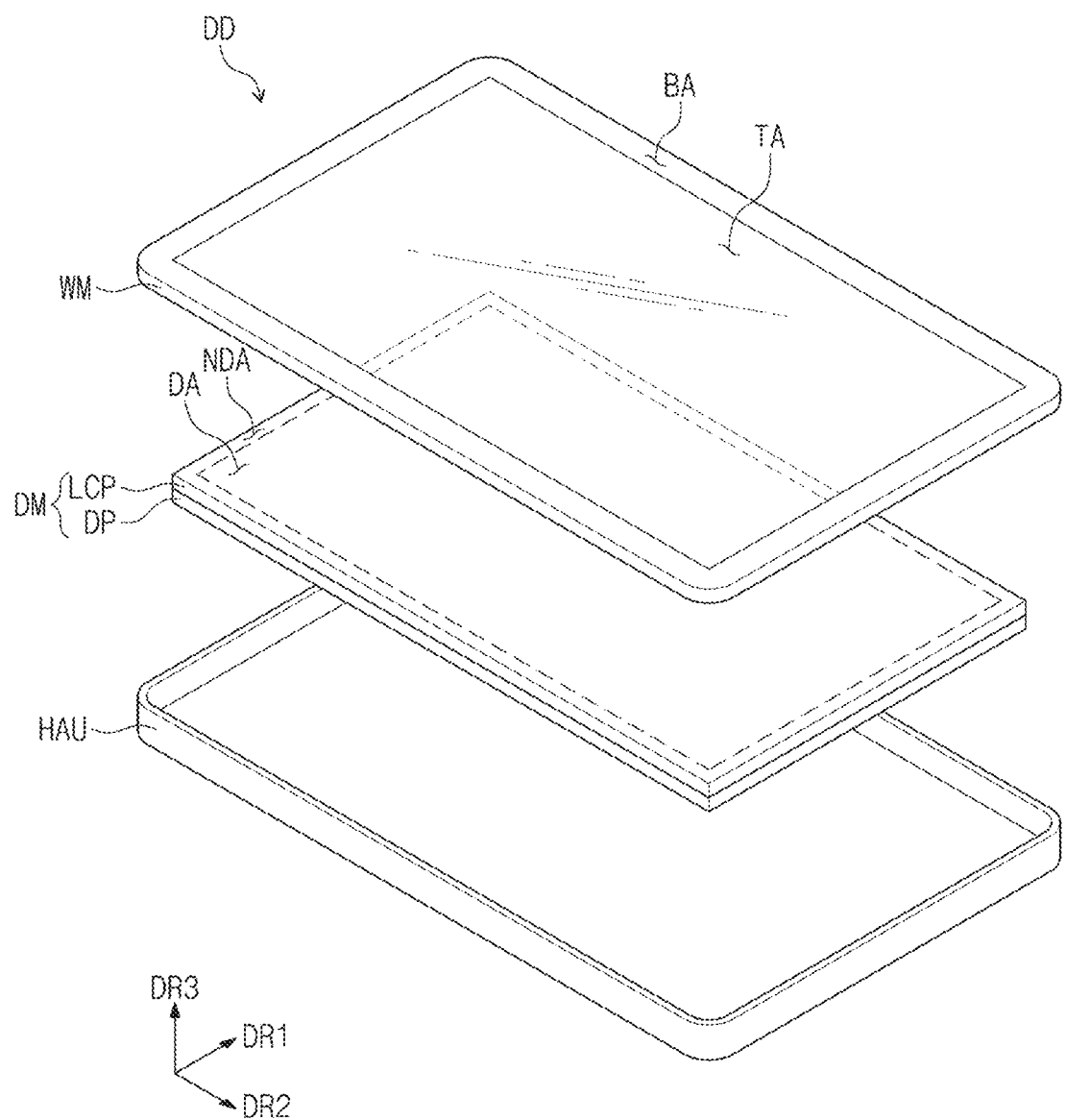
FIG. 2 is an exploded perspective view of a display device shown in FIG. 1.

FIG. 2 is an exploded perspective view of a display device shown in FIG. 1.

Referring to FIG. 2, an embodiment of the display device DD may include a window WM, a display module DM, and a casing HAU. The window WM, the display module DM, and the casing HAU have a rectangular shape having short sides extending in the first direction DR1 and long sides extending in the second direction DR2 intersecting the first direction DR1.

Hereinafter, in the present specification, "up" or "down" may be defined based on the third direction DR3.

The window WM may be disposed on the display module DM. The window WM may have an optically transparent property. The window WM may protect the display module DM from an external impact and a scratch. A front surface of the window WM may correspond to the display surface DS of the display device DD described above.

The front surface of the window WM may include a transmissive area TA and a bezel area BA. The transmissive area TA may transmit light, and the bezel area BA may be printed in the predetermined color to block the light. The transmissive area TA may overlap the aforementioned display area DA, and the bezel area BA may overlap the aforementioned non-display area NDA.

The display module DM may be disposed between the window WM and the casing HAU. The display module DM may include the display area DA and the non-display area NDA around the display area DA. The display area DA and the non-display area NDA may respectively correspond to the display area DA and the non-display area NDA shown in FIG. 1.

The non-display area NDA may surround the display area DA. The display area DA may generate the image and the non-display area NDA may not generate the image. The image generated by the display area DA may be provided to the external user via the transmissive area TA. The non-display area NDA may not be exposed to the outside by the bezel area BA.

The display module DM may include a display panel DP and a light converting portion LCP disposed on the display panel DP. As the light is generated by the display panel DP, the image may be generated. The light converting portion LCP may receive the light generated by the display panel DP, and may convert a color of the received light. In addition, the light converting portion LCP may reduce a reflectance of the external light. Such configuration will be described in detail below.

The casing HAU may be disposed beneath (below or under) the display module DM to accommodate the display module DM therein. The casing HAU may protect the display module DM by absorbing the external impact and blocking external foreign substances, moisture, and the like.

Although not shown, the display device DD may further include an input sensing device disposed between the display panel DP and the light converting portion LCP. The input sensing device may include a plurality of sensing devices (not shown) for sensing an external input. The sensing devices may sense the external input in a capacitive manner. In an embodiment, for example, the input sensing device may be directly manufactured on the display panel DP when manufacturing the display panel DP.

Figure 3:
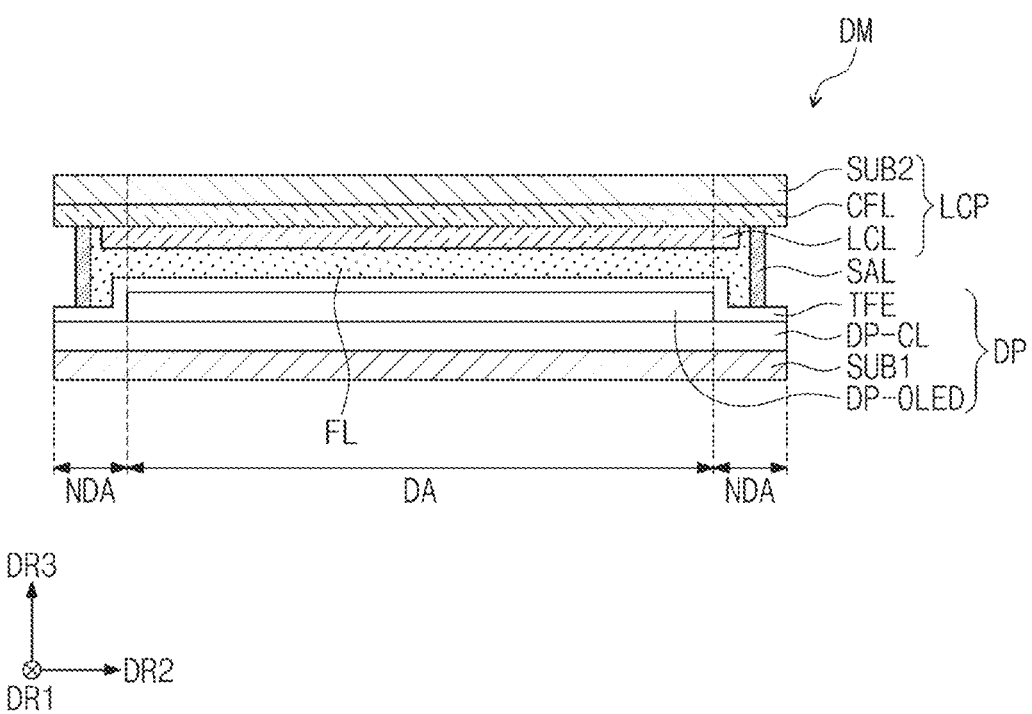
FIG. 3 is a diagram illustrating a cross-section of a display module shown in FIG. 2.

FIG. 3 is a diagram illustrating a cross-section of a display module shown in FIG. 2.

Illustratively, a cross-section of the display panel DP viewed in the first direction DR1 is shown in FIG. 3.

Referring to FIG. 3, an embodiment of the display module DM may include the display panel DP, the light converting portion LCP, and a filler FL, and a sealant SAL. The light converting portion LCP may be disposed on the display panel DP, and the filler FL and the sealant SAL may be disposed between the light converting portion LCP and the display panel DP.

The display panel DP according to an embodiment of the disclosure may be a light emitting display panel, and may not be particularly limited. In an embodiment, for example, the display panel DP may be an organic light emitting display panel or an inorganic light emitting display panel. A light emitting layer of the organic light emitting display panel may include or contain an organic light emitting material. The light emitting layer of the inorganic light emitting display panel may include or contain quantum dots, quantum rods, and the like. Hereinafter, for convenience of description, embodiments where the display panel DP is the organic light emitting display panel will be described.

The sealant SAL may overlap the non-display area NDA and may be disposed between the light converting portion LCP and the display panel DP. The light converting portion LCP and the display panel DP may be bonded together by the sealant SAL. The sealant SAL may include or contain an ultraviolet curable material.

The filler FL may overlap the display area DA and may be disposed between the light converting portion LCP and the display panel DP. The filler FL may extend toward the non-display area NDA and come into contact with the sealant SAL. The filler FL may include or contain a silicone, epoxy, and acryl-based thermosetting material.

The display panel DP may include a first substrate SUB1, a circuit element layer DP-CL, a display element layer DP-OLED, and a thin film encapsulation layer TFE. The light converting portion LCP may include a second substrate SUB2, a color filter layer CFL, and a light converting layer LCL.

The second substrate SUB2 may be disposed on the first substrate SUB1 and may face the first substrate SUB1. The circuit element layer DP-CL, the display element layer DP-OLED, the thin film encapsulation layer TFE, the color filter layer CFL, the light converting layer LCL, the filler FL, and the sealant SAL may be disposed between the first substrate SUB1 and the second substrate SUB2.

The first substrate SUB1 and the second substrate SUB2 may include or contain a glass or a flexible plastic material. In a plan view (or when viewed in the third direction DR3), the first substrate SUB1 may include the display area DA and the non-display area NDA around the display area DA like the display panel DP.

The circuit element layer DP-CL may be disposed on the first substrate SUB1. The display element layer DP-OLED may be disposed on the circuit element layer DP-CL. The display element layer DP-OLED may be disposed on the display area DA.

A plurality of pixels may be disposed in the circuit element layer DP-CL and the display element layer DP-OLED. Each of the pixels may include a transistor disposed in the circuit element layer DP-CL and a light emitting element disposed in the display element layer DP-OLED and connected to the transistor. A configuration of the pixel will be described in detail below.

The thin film encapsulation layer TFE may be disposed on the circuit element layer DP-CL to cover the display element layer DP-OLED. The thin film encapsulation layer TFE may protect the pixels from the moisture, oxygen, and the external foreign substances.

The color filter layer CFL may be disposed beneath the second substrate SUB2. In the plan view, the color filter layer CFL may overlap the display area DA. A portion of the color filter layer CFL may overlap the non-display area NDA.

The light converting layer LCL may be disposed beneath the color filter layer CFL. In the plan view, the light converting layer LCL may overlap the display area DA. A portion of the light converting layer LCL may overlap the non-display area NDA.

The sealant SAL may be disposed between the first substrate SUB1 and the second substrate SUB2. The first substrate SUB1 and the second substrate SUB2 may be bonded together by the sealant SAL. The sealant SAL may be disposed between the thin film encapsulation layer TFE and the color filter layer CFL. The sealant SAL may surround the light converting layer LCL. The filler FL may overlap the display area DA and may be disposed between the light converting layer LCL and the thin film encapsulation layer TFE.

The light generated by the display element layer DP-OLED may be provided to the light converting layer LCL.

The light converting layer LCL may convert the color of light provided from the display element layer DP-OLED. The color-converted light may be emitted to the outside via the color filter layer CFL and the second substrate SUB2.

The color filter layer CFL may prevent reflection of external light provided to the display panel DP from the outside. Such function of the color filter layer CFL will be described in detail below.

Figure 4:
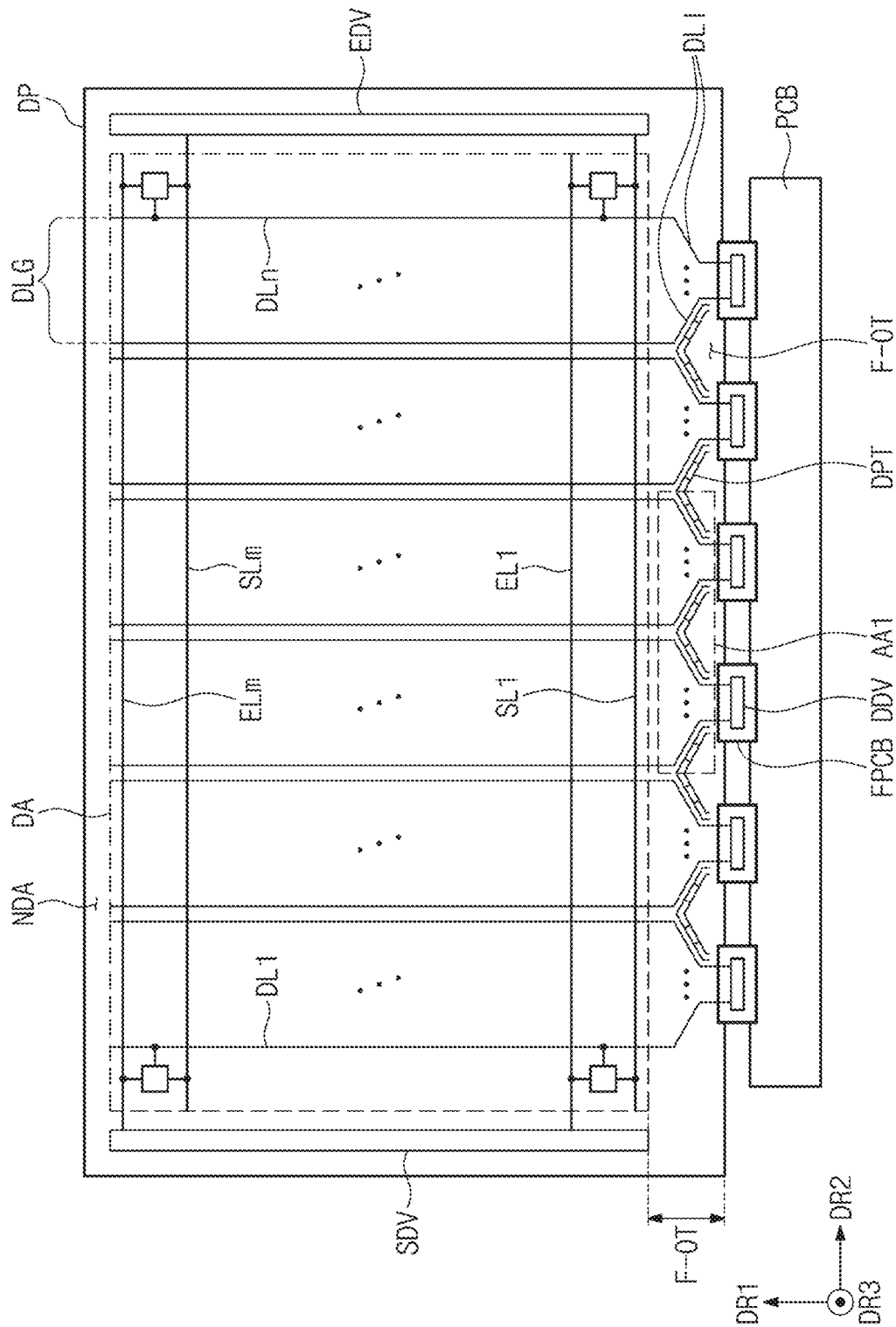
FIG. 4 is a plan view of a display panel shown in FIG. 3.

FIG. 4 is a plan view of a display panel shown in FIG. 3.

Referring to FIG. 4, an embodiment of the display device DD may include the display panel DP, a scan driver SDV, a plurality of data drivers DDV, a plurality of flexible circuit boards FPCB, an emission driver EDV, and a printed circuit board PCB.

The display panel DP may include the display area DA and the non-display area NDA surrounding the display area DA. The display area DA and the non-display area NDA of the display panel DP may respectively correspond to the display area DA and the non-display area NDA shown in FIG. 2.

The display panel DP may include a plurality of pixels PX, a plurality of scan lines SL1 to SLm, a plurality of data lines DL1 to DLn, a plurality of light emitting lines EL1 to ELm, and a plurality of dummy patterns DPT. Here, m and n are natural numbers.

The pixels PX may be disposed in the display area DA. The scan driver SDV and the emission driver EDV may be disposed at sides of the non-display area NDA respectively adjacent to the short sides of the display panel DP.

The data drivers DDV may be disposed adjacent to a lower side of the display panel DP, which is defined as one of the long sides of the display panel DP in the plan view. The data drivers DDV may include or be defined as driving ICs.

The printed circuit board PCB may be disposed adjacent to the lower side of the display panel DP in the plan view. The flexible circuit boards FPCB may be connected to the lower side of the display panel DP and to the printed circuit board PCB. The data drivers DDV may be manufactured in a form of an IC chip and respectively mounted on the flexible circuit boards FPCB.

The scan lines SL1 to SLm may extend in the second direction DR2 to be connected to the pixels PX and the scan driver SDV. The light emitting lines EL1 to ELm may extend in the second direction DR2 to be connected to the pixels PX and the emission driver EDV.

Hereinafter, an area between the lower side of the display panel DP and the display area DA in the plan view (e.g., when viewed in the third direction DR3), that is, a portion of the non-display area NDA between the display area DA and the data drivers DDV, is defined as a fan-out area F-OT.

The data lines DL1 to DLn may extend in the display area DA in the first direction DR1 to be connected to the pixels PX and the data drivers DDV. The scan lines SL1 to SLm and the light emitting lines EL1 to ELm may extend in the display area DA to intersect with the data lines DL1 to DLn in an insulated manner, respectively.

A plurality of data lines may be connected to each of the data drivers DDV. In an embodiment, for example, the data lines DL1 to DLn may be divided into a plurality of data line groups DLG, and each of the data line groups DLG may include a plurality of data lines DLI. The data lines DLI of each of the data line groups DLG may be connected to a corresponding data driver DDV among the data drivers DDV via a corresponding flexible circuit board FPCB among the flexible circuit boards FPCB.

The data lines DLI of each of the data line groups DLG may extend radially from the fan-out area F-OT toward the display area DA. The data lines DLI extending radially in the fan-out area F-OT may further extend linearly in the first direction DR1 in the display area DA.

The dummy patterns DPT may be disposed between the data line groups DLG in the fan-out area F-OT. The dummy patterns DPT may have a hat shape (a caret symbol shape) toward the display area DA between the data line groups DLG. A function of the dummy patterns DPT will be described in detail below.

The dummy patterns DPT may not be connected to the scan lines SL1 to SLm and the light emitting lines EL1 to ELm. The dummy patterns DPT may not be connected to the data lines DL1 to DLn and the data drivers DDV. That is, the dummy patterns DPT may be insulated from surrounding conductors. In addition, the dummy patterns DPT may not be connected to a ground terminal (not shown) and a power terminal (not shown) of the display device DD. The dummy patterns DPT may be independent patterns not connected to other conductors.

Although not shown, the display device DD may further include a timing controller for controlling operations of the scan driver SDV, the data drivers DDV, and the emission driver EDV. The timing controller may be manufactured in the form of the integrated circuit chip and mounted on the printed circuit board PCB. The timing controller may be connected to the data drivers DDV, the scan driver SDV, and the emission driver EDV via the printed circuit board PCB and the flexible circuit board FPCB.

The scan driver SDV may generate a plurality of scan signals, and the scan signals may be applied to the pixels PX via the scan lines SL1 to SLm. The data drivers DDV may generate a plurality of data voltages, and the data voltages may be applied to the pixels PX via the data lines DL1 to DLn. The emission driver EDV may generate a plurality of emission signals, and the emission signals may be applied to the pixels PX via the light emitting lines EL1 to ELm.

The pixels PX may receive the data voltages in response to the scan signals. The pixels PX may display the image by emitting light having a luminance corresponding to the data voltages in response to the emission signals. A light emission time (e.g., timing or duration) of the pixels PX may be controlled by the emission signals.

Figure 5:
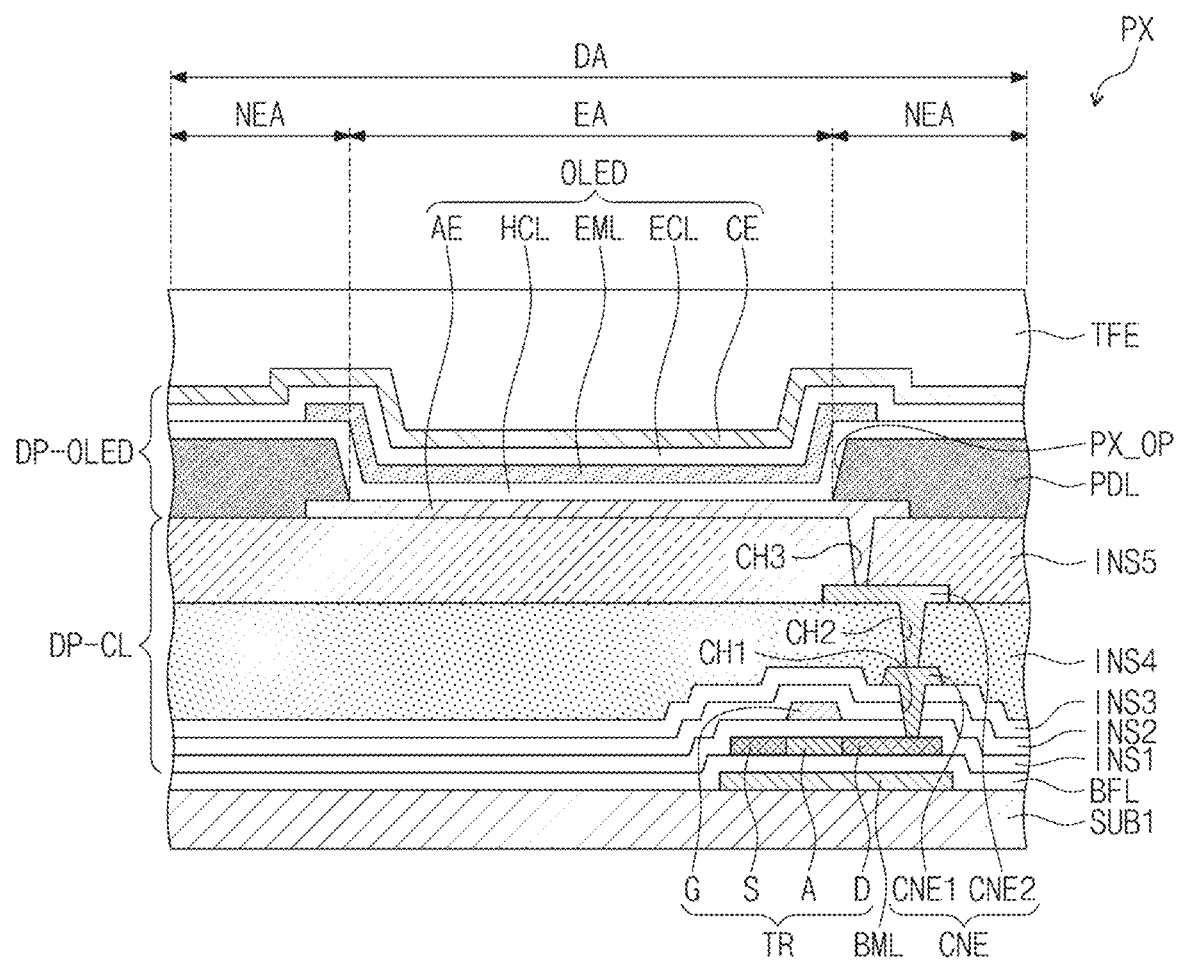
FIG. 5 is a diagram illustrating a cross-section of one pixel shown in FIG. 4.

FIG. 5 is a diagram illustrating a cross-section of one pixel shown in FIG. 4.

Illustratively, a configuration of one pixel PX is shown, but other pixels PX may also have the same configuration as the pixel PX shown in FIG. 5.

Referring to FIG. 5, an embodiment of the pixel PX may include a transistor TR and a light emitting element OLED. The light emitting element OLED may include a first electrode AE (or an anode), a second electrode CE (or a cathode), a hole control layer HCL, an electron control layer ECL, and a light emitting layer EML.

The transistor TR and the light emitting element OLED may be disposed on the first substrate SUB1. Although one transistor TR is shown in FIG. 5 as an example, the pixel PX may include a plurality of transistors and at least one capacitor for driving the light emitting element OLED.

The display area DA may include a light emitting area EA corresponding to each of the pixels PX and a non-light emitting area NEA around the light emitting area EA. The light emitting element OLED may be disposed in the light emitting area EA.

A light blocking layer BML may be disposed on the first substrate SUB1. The light blocking layer BML may include or contain a metal material. A buffer layer BFL may be disposed on the light blocking layer BML. The buffer layer BFL may be disposed on the first substrate SUB1 to cover the light blocking layer BML.

Semiconductor layers S, A, and D may be disposed on the buffer layer BFL. The semiconductor layers S, A, and D may include or contain polysilicon, amorphous silicon, or metal oxide. The semiconductor layer may be doped with an N-type dopant or a P-type dopant. The semiconductor layer may include a highly doped area and a low doped area. Conductivity of the highly doped area may be greater than that of the low doped area, and may substantially serve as a source electrode S and a drain electrode D of the transistor TR. The low doped area may substantially correspond to an active A (or a channel) of the transistor.

The source electrode S, the active A, and the drain electrode D of the transistor TR may be respectively formed from the semiconductor layers S, A, and D. A first insulating layer INS1 may be disposed on the semiconductor layers S, A, and D. A gate electrode G of the transistor TR may be disposed on the first insulating layer INS1. In the plan view, the gate electrode G may overlap the active A. A second insulating layer INS2 may be disposed on the gate electrode G. A third insulating layer INS3 may be disposed on the second insulating layer INS2.

A connection electrode CNE may be disposed between the transistor TR and the light emitting element OLED to connect the transistor TR and the light emitting element OLED to each other. The connection electrode CNE may include a first connection electrode CNE1 and a second connection electrode CNE2.

The first connection electrode CNE1 may be disposed on the third insulating layer INS3, and may be connected to the drain electrode D via a first contact hole CH1 defined in the first to third insulating layers INS1 to INS3. A fourth insulating layer INS4 may be disposed on the first connection electrode CNE1. The fourth insulating layer INS4 may be disposed on the third insulating layer INS3 to cover the first connection electrode CNE1.

The second connection electrode CNE2 may be disposed on the fourth insulating layer INS4. The second connection electrode CNE2 may be connected to the first connection electrode CNE1 via a second contact hole CH2 defined in the fourth insulating layer INS4.

A fifth insulating layer INS5 may be disposed on the second connection electrode CNE2. Layers from the buffer layer BFL to the fifth insulating layer INS5 may be defined as or collectively define the circuit element layer DP-CL. The buffer layer BFL and the first to third insulating layers INS' to INS3 may be inorganic layers. The fourth and fifth insulating layers INS4 and INS5 may be organic layers.

The first electrode AE may be disposed on the fifth insulating layer INS5. The first electrode AE may be connected to the second connection electrode CNE2 via a third contact hole CH3 defined in the fifth insulating layer INS5. A pixel defining film PDL, in which a pixel opening PX_OP for exposing a predetermined portion of the first electrode AE is defined, may be disposed on the first electrode AE and the fifth insulating layer INS5.

The hole control layer HCL may be disposed on the first electrode AE and the pixel defining film PDL. The hole control layer HCL may include a hole transport layer and a hole injection layer.

The light emitting layer EML may be disposed on the hole control layer HCL. The light emitting layer EML may be disposed in the pixel opening PX_OP. The light emitting layer EML may include or contain an organic material and/or an inorganic material. The light emitting layer EML may generate blue light.

The electron control layer ECL may be disposed on the light emitting layer EML and the hole control layer HCL. The electron control layer ECL may include an electron transport layer and an electron injection layer. The hole control layer HCL and the electron control layer ECL may be commonly disposed in the light emitting area EA and the non-light emitting area NEA.

The second electrode CE may be disposed on the electron control layer ECL. The second electrodes CE may be commonly disposed in the pixels PX. A layer in which the light emitting element OLED is disposed may be defined as the display element layer DP-OLED.

The thin film encapsulation layer TFE may be disposed on the second electrode CE to cover the pixel PX. Although not shown, the thin film encapsulation layer TFE may include two inorganic layers and an organic layer between the inorganic layers. The inorganic layers may protect the pixel PX from the moisture/oxygen. The organic layer may protect the pixel PX from the foreign substances such as dust particles.

A first voltage may be applied to the first electrode AE via the transistor TR, and a second voltage may be applied to the second electrode CE. Holes and electrons injected into the light emitting layer EML may be combined with each other to form excitons. As a state of the exciton's transitions to a ground state, the light emitting element OLED may emit the light.

In the plan view, the light blocking layer BML may be disposed to overlap the semiconductor layers S, A, and D. The light blocking layer BML may block the light provided to the semiconductor layers S, A, and D from below the first substrate SUB1. When the light is provided to the semiconductor layers S, A, and D, a threshold voltage characteristic of the transistor TR may be changed. Because the light provided to the semiconductor layers S, A, and D is blocked by the light blocking layer BML, the threshold voltage characteristic of the transistor TR may not be changed.

Figure 6:
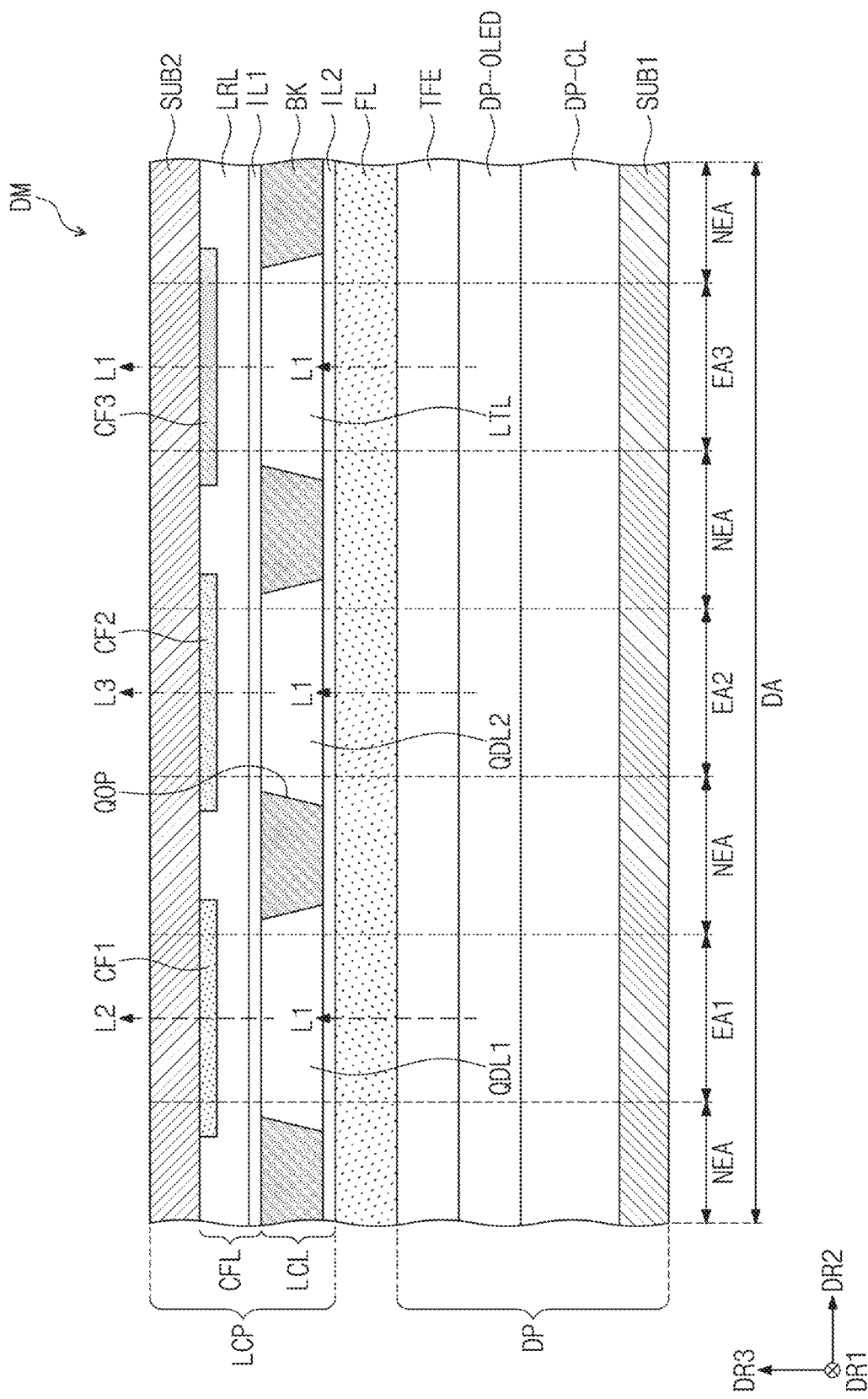
FIG. 6 is a cross-sectional view of a portion of a display area of a display module shown in FIG. 2.

FIG. 6 is a cross-sectional view of a portion of a display area of a display module shown in FIG. 2.

Illustratively, a cross-sectional view of areas corresponding to three light emitting areas EA1, EA2, and EA3 is shown in FIG. 6. In addition, illustratively, in FIG. 6, each of the circuit element layer DP-CL and the display element layer DP-OLED is illustrated as a single layer, but, in the circuit element layer DP-CL and the display element layer DP-OLED, the plurality of transistors TR and the plurality of light emitting elements OLED shown in FIG. 5 may be disposed, respectively, as described above.

Referring to FIG. 6, the display area DA may include the first light emitting area EA1, the second light emitting area EA2, the third light emitting area EA3, and the non-light emitting area NEA disposed around each of the first, second, and third light emitting areas EA1, EA2, and EA3. The first, second, and third light emitting areas EA1, EA2, and EA3 may generate first light L1. In an embodiment, for example, the first light L1 may be blue light. The light emitting area EA shown in FIG. 5 may be one of the first, second, and third light emitting areas EA1, EA2, and EA3.

The color filter layer CFL may include a first color filter CF1, a second color filter CF2, a third color filter CF3, a low refractive layer LRL, and a first insulating layer ILL Illustratively, one first color filter CF1, one second color filter CF2, and one third color filter CF3 are shown, but substantially, the first color filter CF1, the second color filter CF2, and the third color filter CF3 may respectively include the plurality of first color filters CF1, the plurality of second color filters CF2, and the plurality of third color filters CF3.

The light converting layer LCL may include a first quantum dot layer QDL1, a second quantum dot layer QDL2, a light transmitting layer LTL, a bank layer BK, and a second insulating layer IL2. Illustratively, although one first quantum dot layer QDL1, one second quantum dot layer QDL2, and one light transmitting layer LTL are shown, but substantially, the first quantum dot layer QDL1, the second quantum dot layer QDL2, and the light transmitting layer LTL may respectively include the plurality of first quantum dot layers QDL1, the plurality of second quantum dot layers QDL2, and the plurality of light transmitting layers LTL.

The first color filter CF1, the second color filter CF2, and the third color filter CF3 may be disposed beneath the second substrate SUB2. In the plan view, the first color filter CF1 may overlap the first light emitting area EA1, the second color filter CF2 may overlap the second light emitting area EA2, and the third color filter CF3 may overlap the third light emitting area EA3. The first color filter CF1 may include a red color filter. The second color filter CF2 may include a green color filter. The third color filter CF3 may include a blue color filter.

The low refractive layer LRL may be disposed beneath the second substrate SUB2 to cover the first, second, and third color filters CF1, CF2, and CF3. The low refractive layer LRL may have a refractive index less than those of the first quantum dot layer QDL1, the second quantum dot layer QDL2, and the light transmitting layer LTL. The low refractive layer LRL may include an organic layer and a plurality of scattering particles disposed in the organic layer to scatter the light. The first insulating layer IL1 may be disposed beneath the low refractive layer LRL. The first insulating layer IL1 may include an inorganic layer.

The bank layer BK may be disposed beneath the first insulating layer IL1. In the plan view, the bank layer BK may overlap the non-light emitting area NEA. In the bank layer BK, openings QOP respectively overlapping the first, second, and third light emitting areas EA1, EA2, and EA3 may be defined. A width of each of the openings QOP may be greater than a width of the aforementioned pixel opening PX_OP. The bank layer BK may have a black color.

The first and second quantum dot layers QDL1 and QDL2 and the light transmitting layer LTL may be respectively disposed in the openings QOP. Accordingly, the first and second quantum dot layers QDL1 and QDL2 and the light transmitting layer LTL may respectively overlap the first, second, and third light emitting areas EA1, EA2, and EA3 in the plan view. The first quantum dot layer QDL1 may overlap the first light emitting area EA1, the second quantum dot layer QDL2 may overlap the second light emitting area EA2, and the light transmitting layer LTL may overlap the third light emitting area EA3.

The second insulating layer IL2 may be disposed beneath the bank layer BK, the first and second quantum dot layers QDL1 and QDL2, and the light transmitting layer LTL. The second insulating layer IL2 may include an inorganic layer.

The first light L1 generated from the first, second, and third light emitting areas EA1, EA2, and EA3 may be provided to the first and second quantum dot layers QDL1 and QDL2 and the light transmitting layer LTL. The first light L1 generated from the first light emitting area EA1 may be provided to the first quantum dot layer QDL1, and the first light L1 generated from the second light emitting area EA2 may be provided to the second quantum dot layer QDL2. The first light L1 generated from the third light emitting area EA3 may be provided to the light transmitting layer LTL.

The first quantum dot layer QDL1 may convert the first light L1 into second light L2. The second quantum dot layer QDL2 may convert the first light L1 into third light L3. In an embodiment, for example, the second light L2 may be red light, and the third light L3 may be green light. The first quantum dot layer QDL1 may include or contain first quantum dots (not shown), and the second quantum dot layer QDL2 may include or contain second quantum dots (not shown). The light transmitting layer LTL may include or contain light scattering particles (not shown).

The first quantum dots may convert the first light L1 having a blue wavelength band to the second light L2 having a red wavelength band. The second quantum dots may convert the first light L1 having the blue wavelength band to the third light L3 having a green wavelength band. The first and second quantum dots may scatter the second and third light L2 and L3.

The light transmitting layer LTL may transmit the first light L1 without performing a light conversion operation. The first light L1 may be scattered by the light scattering particles of the light transmitting layer LTL and emitted. The light scattering particles may be included or contained in the first and second quantum dot layers QDL1 and QDL2.

The first quantum dot layer QDL1 may emit the second light L2, the second quantum dot layer QDL2 may emit the third light L3, and the light transmitting layer LTL may emit the first light L1. Accordingly, the image may be displayed by the second light L2, the third light L3, and the first light L1 respectively exhibiting the red, the green, and the blue.

The first, second, and third light L1, L2, and L3 emitted from the light converting layer LCL may pass through the low refractive layer LRL, the first, second, and third color filters CF1, CF2, and CF3, and the second substrate SUB2 and be provided to the user. The first, second, and third light L1, L2, and L3 may be refracted in the low refractive layer LRL and then more scattered by the scattering particles disposed in the low refractive layer LRL and emitted.

A portion of the first light L1 may be provided to the first color filter CF1 by passing through the first quantum dot layer QDL1 without being converted by the first quantum dots. That is, there may be the first light L1 that has not been converted into the second light L2 because of not being in contact with the first quantum dots. The first color filter CF1 may block light other than the second light L2, that is, light having colors different from that of the second light L2. The first light L1 that has not been converted in the first quantum dot layer QDL1 may be blocked by the first color filter CF1 having the red color filter not to be emitted upwardly.

A portion of the first light L1 may be provided to the second color filter CF2 by passing through the second quantum dot layer QDL2 without being converted by the second quantum dots. That is, there may be the first light L1 that has not been converted into the third light L3 because of not being in contact with the second quantum dots. The second color filter CF2 may block light other than the third light L3. The second color filter CF2 may block light of different colors. The first light L1 that has not been converted in the second quantum dot layer QDL2 may be blocked by the second color filter CF2 having the green color filter so as not to be emitted upwardly.

The external light may be provided toward the display panel DP from above the display device DD. The external light may be white light. The white light may include or contain red light, green light, and blue light. In a case where the first, second, and third color filters CF1, CF2, and CF3 are not used, the external light may be provided to the external user as it is after being reflected on metal layers (e.g., the lines) inside the display panel DP. In this case, the external light may be viewed by the user, like light reflected from a mirror.

The first, second, and third color filters CF1, CF2, and CF3 may prevent the reflection of the external light. In an embodiment, for example, the first, second, and third color filters CH, CF2, and CF3 may filter the external light into the red, green, and blue colors.

In such an embodiment, the green light and the blue light of the external light provided to the first color filter CF1 may be blocked by the first color filter CF1 including the red color filter. Accordingly, the external light provided to the first color filter CF1 may be filtered by the first color filter CF1 into the same red light as the light emitted from the first quantum dot layer QDL1.

The red light and the blue light of the external light provided to the second color filter CF2 may be blocked by the second color filter CF2, which is the green color filter. Accordingly, the external light provided to the second color filter CF2 may be filtered by the second color filter CF2 into the same green light as the light emitted from the second quantum dot layer QDL2.

The red light and the green light of the external light provided to the third color filter CF3 may be blocked by the third color filter CF3, which is the blue color filter. Accordingly, the external light provided to the third color filter CF3 may be filtered by the third color filter CF3 into the same blue light as the light emitted from the light transmitting layer LTL. In such an embodiment, as described above, the external light is blocked by the first, second, and third color filters CF1, CF2, and CF3, such that the reflection of the external light may be reduced.

The bank layer BK having the black color may block undesired light in the non-light emitting area NEA. In an embodiment, for example, the bank layer BK may prevent color mixing between the first light L1, the second light L2, and the third light L3 in the non-light emitting area NEA.

Figure 7:
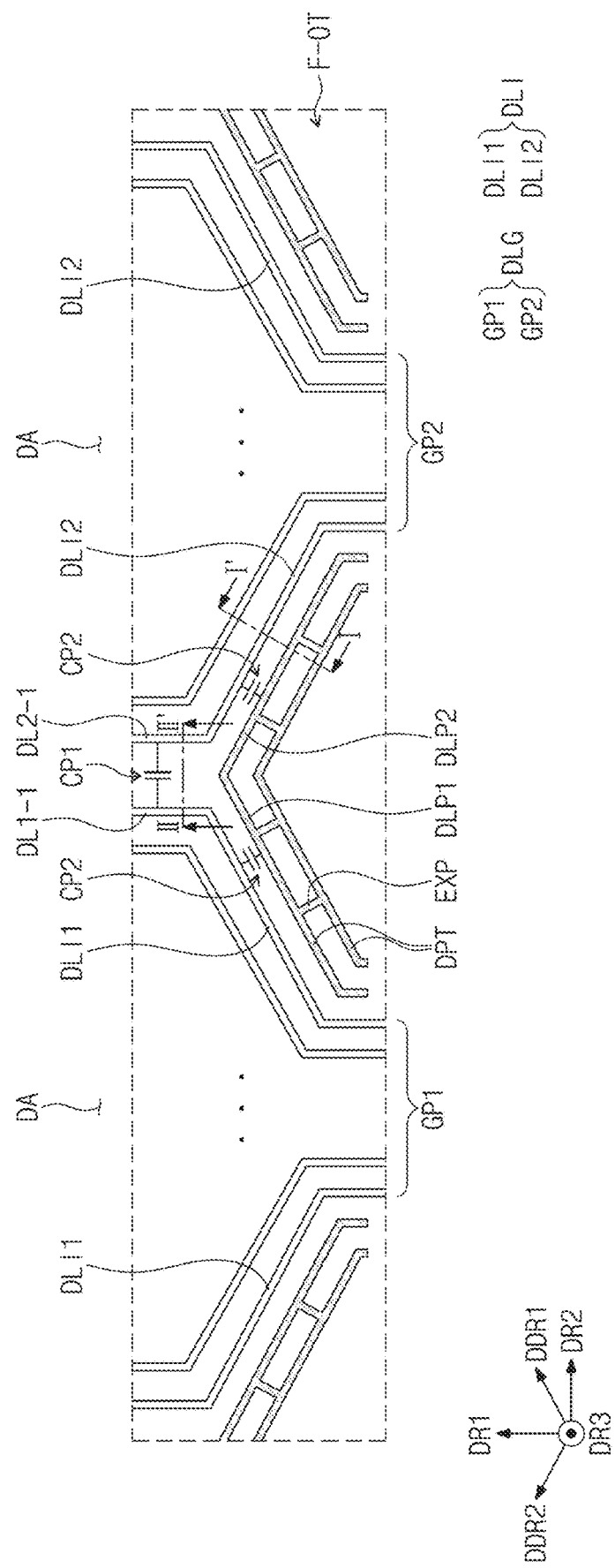
FIG. 7 is an enlarged view of an area AA1 shown in FIG. 4.

FIG. 7 is an enlarged view of an area AA1 shown in FIG. 4.

Hereinafter, the data line groups DLG shown in the area AA1 are defined as a first data line group GP1 and a second data line group GP2.

Referring to FIG. 7, the data line groups DLG may include the first data line group GP1 and the second data line group GP2. The first data line group GP1 and the second data line group GP2 may be disposed in the fan-out area F-OT and may be adjacent to each other in the second direction DR2.

The first data line group GP1 may include a plurality of first data lines DLI1 extending to the display area DA adjacent to the fan-out area F-OT (i.e., to an end portion of the display area DA adjacent to the fan-out area F-OT). The second data line group GP2 may include a plurality of second data lines DLI2 extending to the display area DA adjacent to the fan-out area F-OT. The first data lines DLI1 and the second data lines DLI2 may be included in the data lines of each of the data line groups DLG described above.

The first data lines DLI1 may extend radially in the fan-out area F-OT toward the display area DA. The second data lines DLI2 may extend radially in the fan-out area F-OT toward the display area DA.

The first data lines DLI1 and the second data lines DLI2 may extend radially to have substantially a same shape as each other. The first data lines DLI1 and the second data lines DLI2 may be formed by being simultaneously patterned with (or using) a same material in a same layer. The first data lines DLI1 and the second data lines DLI2 may further extend in the first direction DR1 in the fan-out area F-OT adjacent to the display area DA.

The dummy patterns DPT may be disposed between the first data line group GP1 and the second data line group GP2. The dummy patterns DPT may have the hat shape and may be disposed adjacent to the first data line group GP1 and the second data line group GP2. As described above, the dummy patterns DPT may be electrically separated independent patterns that are insulated from the surrounding conductors.

A plurality of extending patterns EXP may be disposed between the dummy patterns DPT. The extending patterns EXP may extend from portions of an h-th dummy pattern DPT among the plurality of dummy patterns DPT to portions of an (h+1)-th dummy pattern DPT. Here, h is a natural number. Illustratively, the h-th dummy pattern DPT and the (h+1)-th dummy pattern DPT are adjacent dummy patterns DPT in the first direction DR1, and the h-th dummy pattern DPT may be more adjacent to the first data line group GP1 and the second data line group GP2 than the (h+1)-th dummy pattern DPT.

The extending patterns EXP may be integrally formed with the dummy patterns DPT as a single unitary and indivisible part. The dummy patterns DPT may be integrally formed with the extending patterns EXP. However, the disclosure may not be limited thereto, and alternatively the extending patterns EXP may be disposed in a layer different from that of the dummy patterns DPT, and may be connected to the dummy patterns DPT through contact holes.

The dummy patterns DPT may be in a floating state. In an embodiment, for example, a separate voltage may not be applied to the dummy patterns DPT. The first voltage and the second voltage respectively applied to the anode AE and the cathode CE of the pixel PX may not be applied to the dummy patterns DPT. In an embodiment, the display device DD may include a voltage generator (not shown) for generating the first voltage and the second voltage. The dummy patterns DPT may not be connected to a power terminal of the voltage generator.

Hereinafter, a line among the first data lines DLI1 adjacent to the second data line group GP2 is defined as a first data line DL1-1, and a line among the second data lines DLI2 adjacent to the first data line group GP1 is defined as a first second data line DL2-1.

Hereinafter, on the plane defined by the first and second directions DR1 and DR2, a direction intersecting the first and second directions DR1 and DR2 is defined as a first diagonal direction DDR1. A direction intersecting the first diagonal direction DDR1 is defined as a second diagonal direction DDR2.

The first data line DL1-1 and the first second data line DL2-1 may be adjacent to each other in the second direction DR2 to have a symmetrical shape. The first data line DL1-1 may extend in the first direction DR1 toward the display area DA, then extend in the first diagonal direction DDR1, and then extend further in the first direction DR1. The first second data line DL2-1 may extend in the first direction DR1 toward the display area DA, then extend in the second diagonal direction DDR2, and then extend further in the first direction DR1.

A distance between a portion of the first data line DL1-1 extending in the first diagonal direction DDR1 and a portion of the first second data line DL2-1 extending in the second diagonal direction DDR2 may gradually increase as a distance from the display area DA increases.

The dummy patterns DPT may be disposed adjacent to the first data line DL1-1 and the first second data line DL2-1. The portions of the dummy patterns DPT connected to each other by the extending patterns EXP may extend parallel to each other. The dummy patterns DPT may be spaced apart from each other and extend parallel to the first data line DL1-1 and the first second data line DL2-1.

Each of the dummy patterns DPT may include a first dummy line pattern DLP1 extending parallel to the first data line DL1-1 and a second dummy line pattern DLP2 extending parallel to the first second data line DL2-1. The first dummy line pattern DLP1 may be disposed adjacent to the first data line DL1-1, and the second dummy line pattern DLP2 may be disposed adjacent to the first second data line DL2-1.

The first dummy line pattern DLP1 and the second dummy line pattern DLP2 may extend to be symmetrical to each other. The first dummy line pattern DLP1 may extend in the first direction DR1 toward the display area DA, and then extend in the first diagonal direction DDR1. The second dummy line pattern DLP2 may extend in the first direction DR1 toward the display area DA, and then extend in the second diagonal direction DDR2.

A distance between a portion of the first dummy line pattern DLP1 extending in the first diagonal direction DDR1 and a portion of the second dummy line pattern DLP2 extending in the second diagonal direction DDR2 may gradually increase as the distance from the display area DA increases.

The second dummy line pattern DLP2 may be bent from a distal end of the first dummy line pattern DLP1 adjacent to the display area DA and extend. Based on such structures of the first dummy line pattern DLP1 and the second dummy line pattern DLP2, each of the dummy patterns DPT may have the hat shape.

A first parasitic capacitor CP1 may be formed by the first first data line DL1-1 and the first second data line DL2-1 extending in the first direction DR1 that are closer to the display area DA than the dummy line patterns DPT.

A second parasitic capacitor CP2 may be formed by the first first data line DL1-1 and the first dummy line pattern DLP1. In addition, the second parasitic capacitor CP2 may be formed by the first second data line DL2-1 and the second dummy line pattern DLP2.

Figure 8:
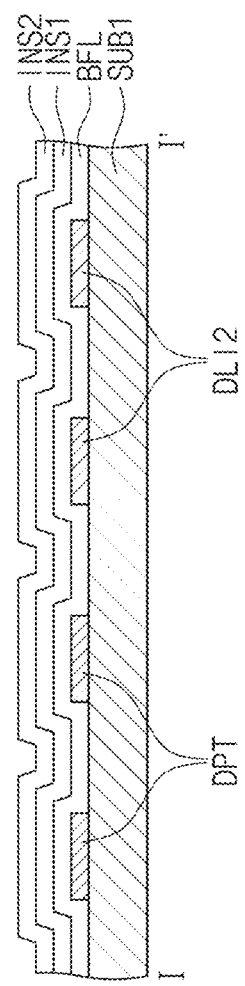
FIG. 8 is a cross-sectional view taken along line I-I' shown in FIG. 7.

FIG. 8 is a cross-sectional view taken along line I-I' shown in FIG. 7.

Referring to FIG. 8, the dummy patterns DPT and the second data lines DLI2 may be disposed in a same layer on the first substrate SUB1. Although not shown, the first data lines DLI1 may also be disposed in the same layer on the first substrate SUB1. Hereinafter, a configuration of the disclosure will be described assuming that the first data lines DLI1 are also disposed in the same layer on the first substrate SUB1.

The dummy patterns DPT and the first and second data lines DLI1 and DLI2 may be disposed in the same layer as each other. The dummy patterns DPT and the first and second data lines DLI1 and DLI2 may be formed by being simultaneously patterned with a same material directly on a same layer.

The dummy patterns DPT and the first and second data lines DLI1 and DLI2 may be disposed directly on the first substrate SUB1. The dummy patterns DPT and the first and second data lines DLI1 and DLI2 may be disposed in the same layer as the light blocking layer BML shown in FIG. 5. The dummy patterns DPT and the first and second data lines DLI1 and DLI2 may be formed by being simultaneously patterned with a same material as that of the light blocking layer BML.

The buffer layer BFL may be disposed on the dummy patterns DPT and the first and second data lines DLI1 and DLI2. The buffer layer BFL may be disposed on the first substrate SUB1 to cover the dummy patterns DPT and the first and second data lines DLI1 and DLI2. The first insulating layer INS1 and the second insulating layer INS2 may be sequentially disposed on the buffer layer BFL. The buffer layer BFL, the first insulating layer INS1, and the second insulating layer INS2 may be defined as insulating layers.

Illustratively, the components from the first substrate SUB1 to the second insulating layer INS2 are shown in the cross-sectional view in FIG. 8, and other components on the second insulating layer INS2 are omitted for convenience of illustration.

Figure 9A:
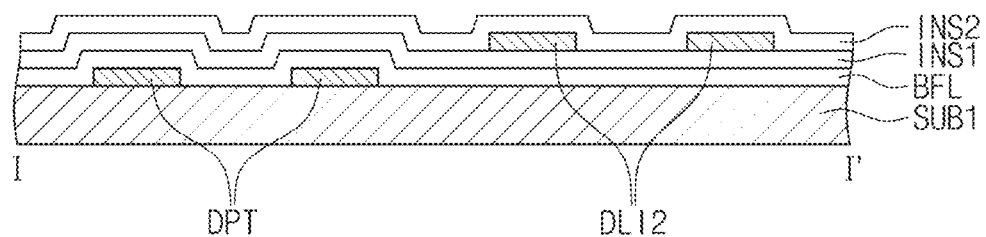
FIG. 9A and FIG. 9B are cross-sectional views taken along line I-I' shown in FIG. 7 according to an embodiment of the disclosure.
Figure 9B:
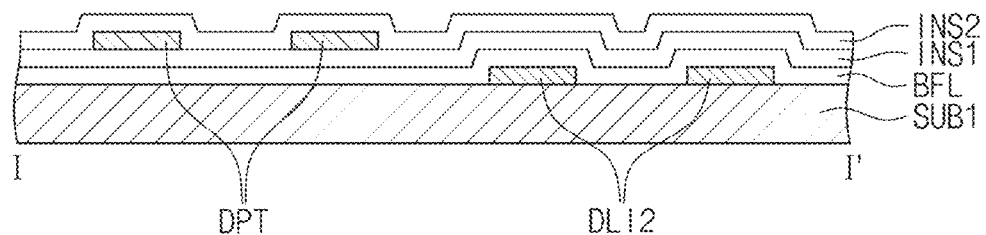

FIG. 9A and FIG. 9B are cross-sectional views taken along line I-I' shown in FIG. 7 according to an embodiment of the disclosure.

Hereinafter, different features of embodiments shown in FIG. 9A and FIG. 9B from those shown in FIG. 8 will be described in detail.

Referring to FIG. 9A, in an alternative embodiment, the dummy patterns DPT may be disposed in a layer different from a layer of the first and second data lines DLI1 and DLI2. The dummy patterns DPT may be disposed directly on the first substrate SUB1. The buffer layer BFL may be disposed on the first substrate SUB1 to cover the dummy patterns DPT, and the first insulating layer INS1 may be disposed on the buffer layer BFL.

The first and second data lines DLI1 and DLI2 may be disposed on the first insulating layer INS1. The second insulating layer INS2 may be disposed on the first insulating layer INS1 to cover the first and second data lines DLI1 and DLI2.

The first and second data lines DLI1 and DLI2 may be disposed in a same layer as the gate electrode G shown in FIG. 5. The first and second data lines DLI1 and DLI2 may be formed by being simultaneously patterned with a same material as that of the gate electrode G.

Referring to FIG. 9B, in another alternative embodiment, the first and second data lines DLI1 and DLI2 may be disposed in a layer different from a layer of the dummy patterns DPT. The first and second data lines DLI1 and DLI2 may be disposed directly on the first substrate SUB1. The buffer layer BFL may be disposed on the first substrate SUB1 to cover the first and second data lines DLI1 and DLI2, and the first insulating layer INS1 may be disposed on the buffer layer BFL.

The dummy patterns DPT may be disposed on the first insulating layer INS1. The second insulating layer INS2 may be disposed on the first insulating layer INS1 to cover the dummy patterns DPT.

The dummy patterns DPT may be disposed in a same layer as the gate electrode G shown in FIG. 5. The dummy patterns DPT may be formed by being simultaneously patterned with a same material as that of the gate electrode G.

Figure 10:
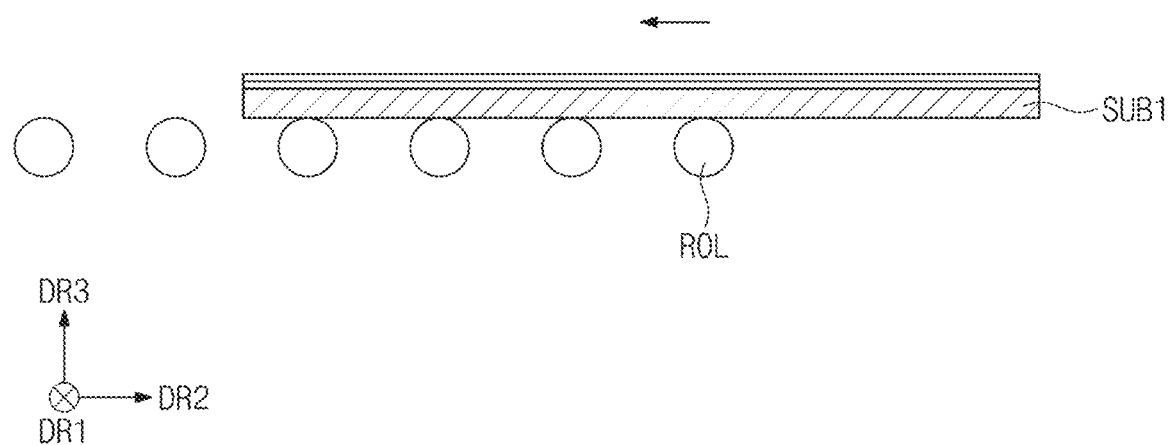
FIG. 10 is a diagram illustrating a first substrate in a moving state after predetermined layers are formed on a first substrate shown in FIG. 8.
Figure 11A:
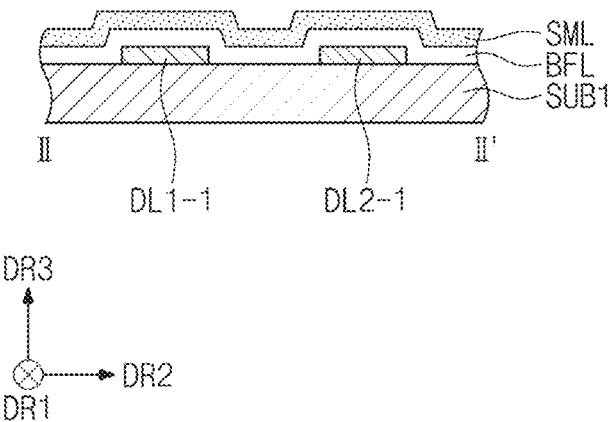
FIG. 11A is a diagram illustrating layers formed on a first substrate shown in FIG. 10 corresponding to a cross-section taken along line shown in FIG. 8.
Figure 11B:
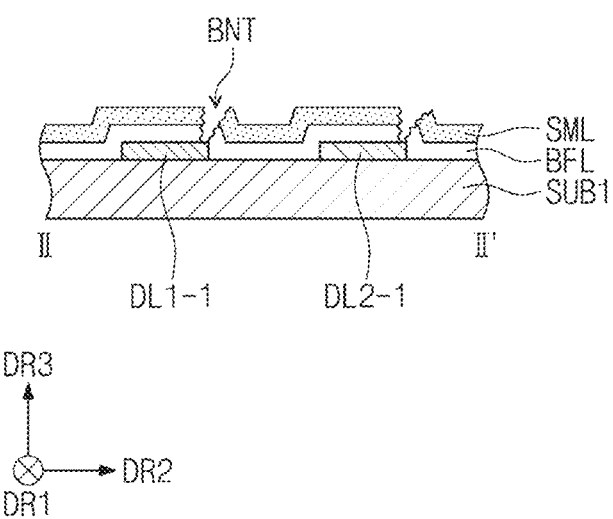
FIG. 11B is a diagram showing a damaged state of components on a first substrate shown in FIG. 11A.

FIG. 10 is a diagram illustrating a first substrate in a moving state after predetermined layers are formed on a first substrate shown in FIG. 8. FIG. 11A is a diagram illustrating layers formed on a first substrate shown in FIG. 10 corresponding to a cross-section taken along line II-IP shown in FIG. 8. FIG. 11B is a diagram showing a damaged state of components on a first substrate shown in FIG. 11A.

Hereinafter, in FIG. 10, FIG. 11A and FIG. 11B, the components on the first substrate SUB1 will be described in a case where no dummy patterns DPT shown in FIG. 8 is provided.

Referring to FIG. 10 and FIG. 11A, the first data line DL1-1 and the first second data line DL2-1 may be formed on the first substrate SUB1, and the buffer layer BFL may be formed on the first data line DL1-1 and the first second data line DL2-1. A semiconductor layer SML may be formed on the buffer layer BFL. The semiconductor layer SML may be patterned to form the source electrode S, the drain electrode D, and the active A described above.

Referring to FIG. 10 and FIG. 11A, the first substrate SUB1 may be transferred to a process chamber for patterning the semiconductor layer SML. The first substrate SUB1 may be transferred via transfer rollers ROL. The first substrate SUB1 may be transferred from right to left via the transfer rollers ROL.

When the first substrate SUB1 is transferred, the first data line DL1-1 may be electrically charged by friction between the first substrate SUB1 and the transfer rollers ROL. The first data line DL1-1, which first comes into contact with the transfer rollers ROL via the first substrate SUB1, may be charged first.

In this case, as a potential difference between the first data line DL1-1 and the first second data line DL2-1 increases rapidly, a burnt phenomenon BNT may occur because of static electricity. Portions of the buffer layer BFL and portions of the semiconductor layer SML on the first data line DL1-1 and the first second data line DL2-1 may be damaged by the burnt phenomenon BNT.

Figure 12:
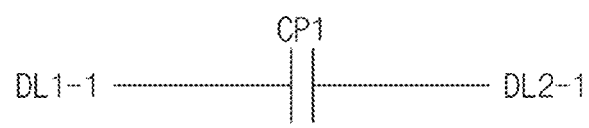
FIG. 12 is a diagram illustrating a circuit diagram of a first parasitic capacitor formed by a first data line and a first second data line when there is no dummy pattern in FIG. 7.
Figure 13:
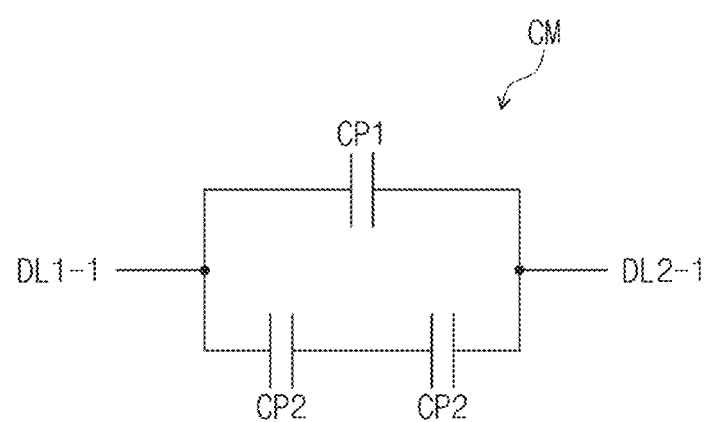
FIG. 13 is a diagram illustrating a circuit diagram of first and second parasitic capacitors formed by a dummy pattern, a first data line, and a first second data line.

FIG. 12 is a diagram illustrating a circuit diagram of a first parasitic capacitor formed by a first data line and a first second data line when there is no dummy pattern in FIG. 7. FIG. 13 is a diagram illustrating a circuit diagram of first and second parasitic capacitors formed by a dummy pattern, a first data line, and a first second data line.

Referring to FIG. 12, the first parasitic capacitor CP1 formed by the first data line DL1-1 and the first second data line DL2-1 may have a first capacitance.

Referring to FIG. 13, when the second parasitic capacitors CP2 are connected in parallel to the first parasitic capacitor CP1, a composite capacitor CM may be formed by the first and second parasitic capacitors CP1 and CP2. That is, the composite capacitor CM may be formed between the first data line DL1-1 and the first second data line DL2-1. A capacitance of the composite capacitor CM may be a second capacitance. The second capacitance may be greater than the first capacitance.

Amounts of charge to be charged to the first data line DL1-1 in FIGS. 12 and 13 may be the same as each other.

In a case where the amounts of charge to be charged are the same, when the capacitance of the capacitor is small, a potential difference between both ends of the capacitor may be relatively large compared to the capacitance of the capacitor. Therefore, when the capacitance of the capacitor is small, the amount of charge to be charged may be greater than the capacitance of the capacitor, and as a result, the capacitor may be damaged by the static electricity.

Conversely, even in the case where the amounts of charge to be charged are the same, when the capacitance of the capacitor is large, the potential difference between both ends of the capacitor may be relatively small compared to the capacitance of the capacitor. Therefore, when the capacitance of the capacitor is large, the capacitor may sufficiently accommodate the amount of charge to be charged. As a result, generation of the static electricity may be reduced, so that the capacitor may not be damaged.

In the first parasitic capacitor CP1 having the smaller first capacitance, the potential difference between the first data line DL1-1 and the first second data line DL2-1 may be relatively large by the amount of charge to be charged to the first first data line DL1-1. Accordingly, as described in FIG. 11B, the burnt phenomenon BNT may occur by the static electricity, so that the components on the first substrate SUB1 may be damaged.

In an embodiment of the disclosure, the composite capacitor CM having the relatively large second capacity may be formed between the first data line DL1-1 and the first second data line DL2-1. Accordingly, the potential difference between the first data line DL1-1 and the first second data line DL2-1 may be relatively small. As a result, the generation of the static electricity may be reduced to prevent the burnt phenomenon BNT, and the damage to the components on the first substrate SUB1 may be effectively prevented.

FIGS. 14 to 17 are diagrams showing configurations of dummy patterns according to various embodiments of the disclosure.

Illustratively, FIGS. 14 to 17 are plan views corresponding to FIG. 7. Hereinafter, various embodiments of dummy pattern DPT-1 to DPT-4 shown in FIGS. 14 to 17 will be described, focusing on different features thereof from the dummy patterns DPT shown in FIG. 7. Because the features of the first and second data line groups GP1 and GP2 shown in FIGS. 14 to 17 are the same as the features of the first and second data line groups GP1 and GP2 shown in FIG. 7, any repetitive detailed description thereof will be omitted.

Figure 14:
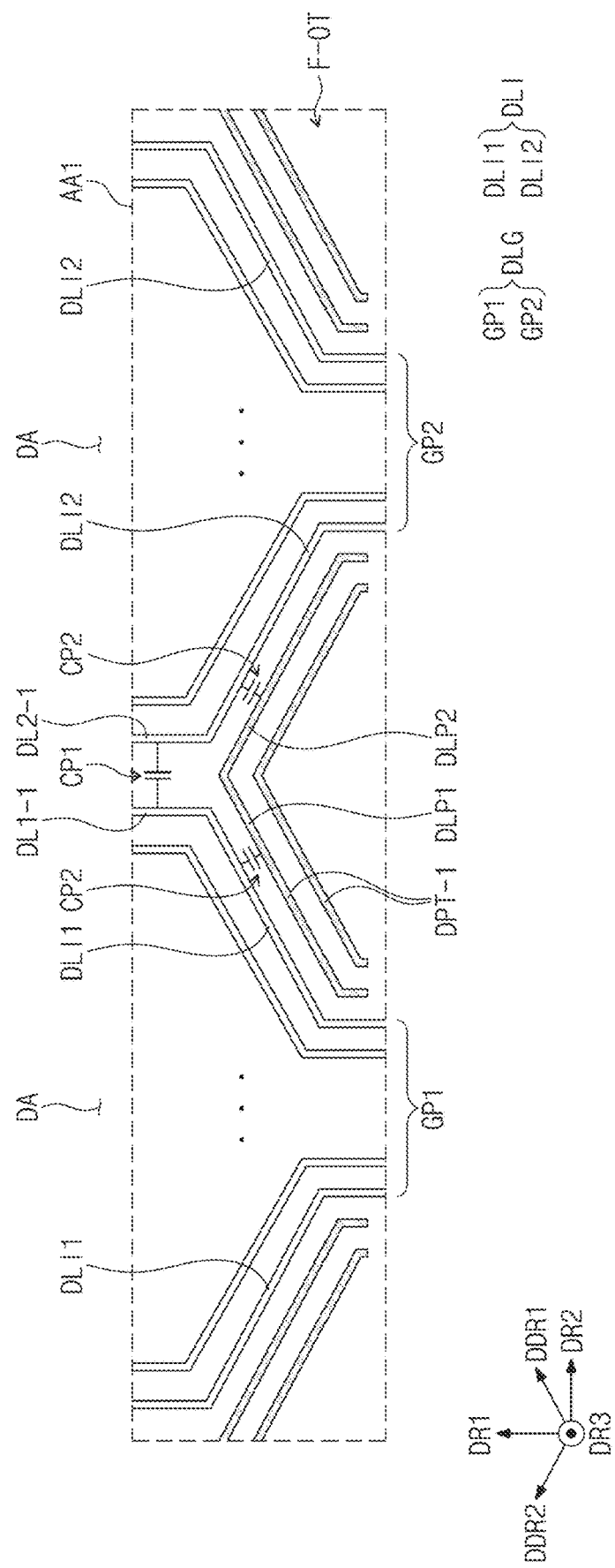
FIGS. 14 to 17 are diagrams showing configurations of dummy patterns according to various embodiments of the disclosure.

Referring to FIG. 14, in an embodiment, the dummy patterns DPT-1 may be disposed between the first data line DL1-1 and the first second data line DL2-1. Each of the dummy patterns DPT-1 may have the hat shape. The dummy patterns DPT-1 may be spaced apart from each other and extend parallel to each other. The dummy patterns DPT-1 may extend parallel to the first data line DL1-1 and the first second data line DL2-1.

In such an embodiment, as shown in FIG. 14, the extending patterns EXP shown in FIG. 7 may be omitted. Except that the extending patterns EXP are omitted, the dummy patterns DPT-1 may have substantially the same configuration as the dummy patterns DPT shown in FIG. 7. The dummy patterns DPT-1 may not be formed integrally with each other and may be electrically isolated from each other.

Figure 15:
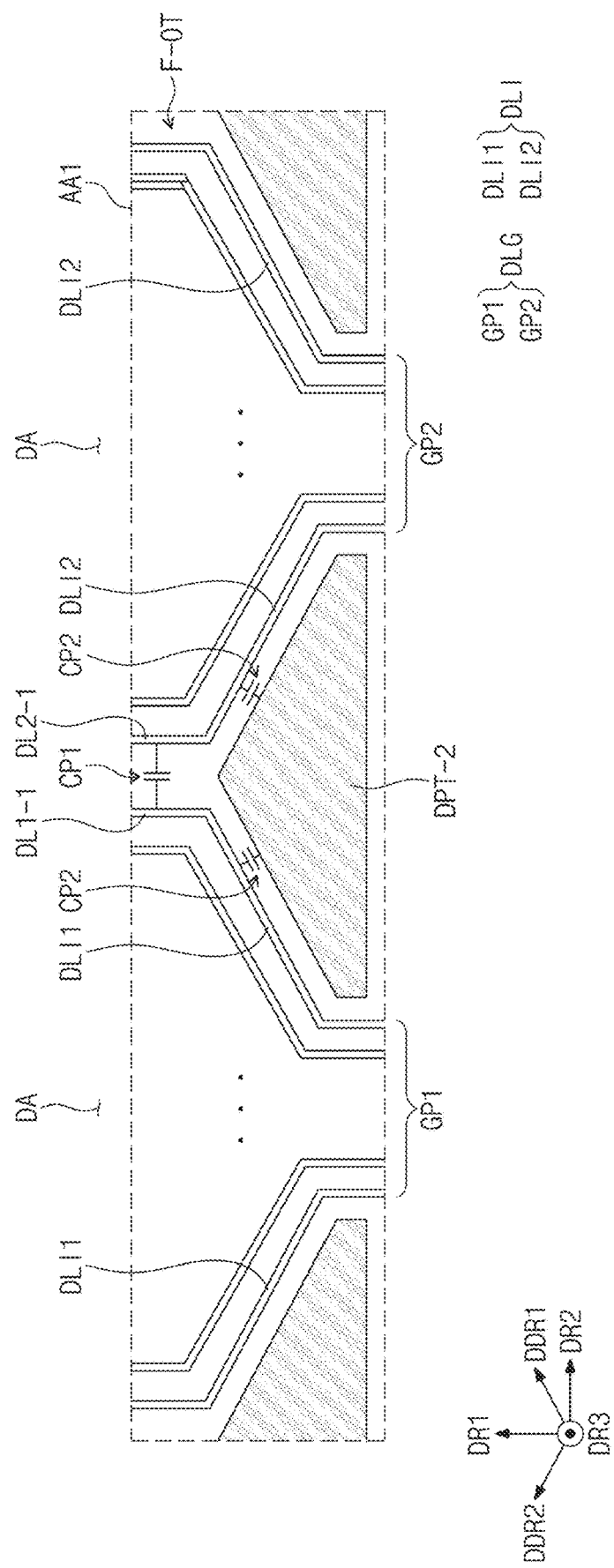

Referring to FIG. 15, in an alternative embodiment, the dummy pattern DPT-2 having a polygonal shape may be disposed between the first data line DL1-1 and the first second data line DL2-1. The dummy pattern DPT-2 may be formed in a shape of a polygonal tubular electrode.

An area of the dummy pattern DPT-2 may be larger than that of the dummy pattern DPT shown in FIG. 7. In such an embodiment, because a capacity of the second parasitic capacitors CP2 increases, the generation of the static electricity may be further reduced, so that the burnt phenomenon BNT may be further prevented.

Figure 16:
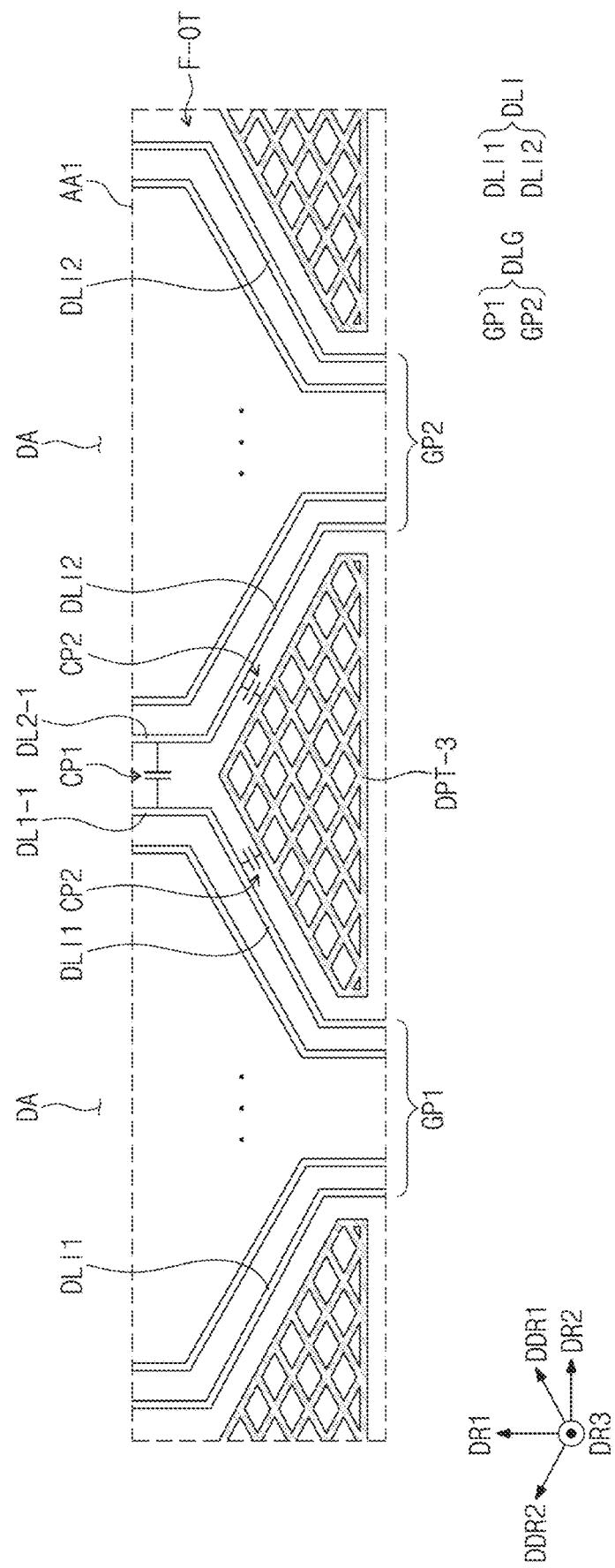

Referring to FIG. 16, in an alternative embodiment, the dummy pattern DPT-3 having a mesh shape may be disposed between the first data line DL1-1 and the first second data line DL2-1. An area of the dummy pattern DPT-3 may be larger than that of the dummy pattern DPT shown in FIG. 7. In such an embodiment, because the capacity of the second parasitic capacitors CP2 increases, the generation of the static electricity may be further reduced, so that the burnt phenomenon BNT may be further prevented.

Figure 17:
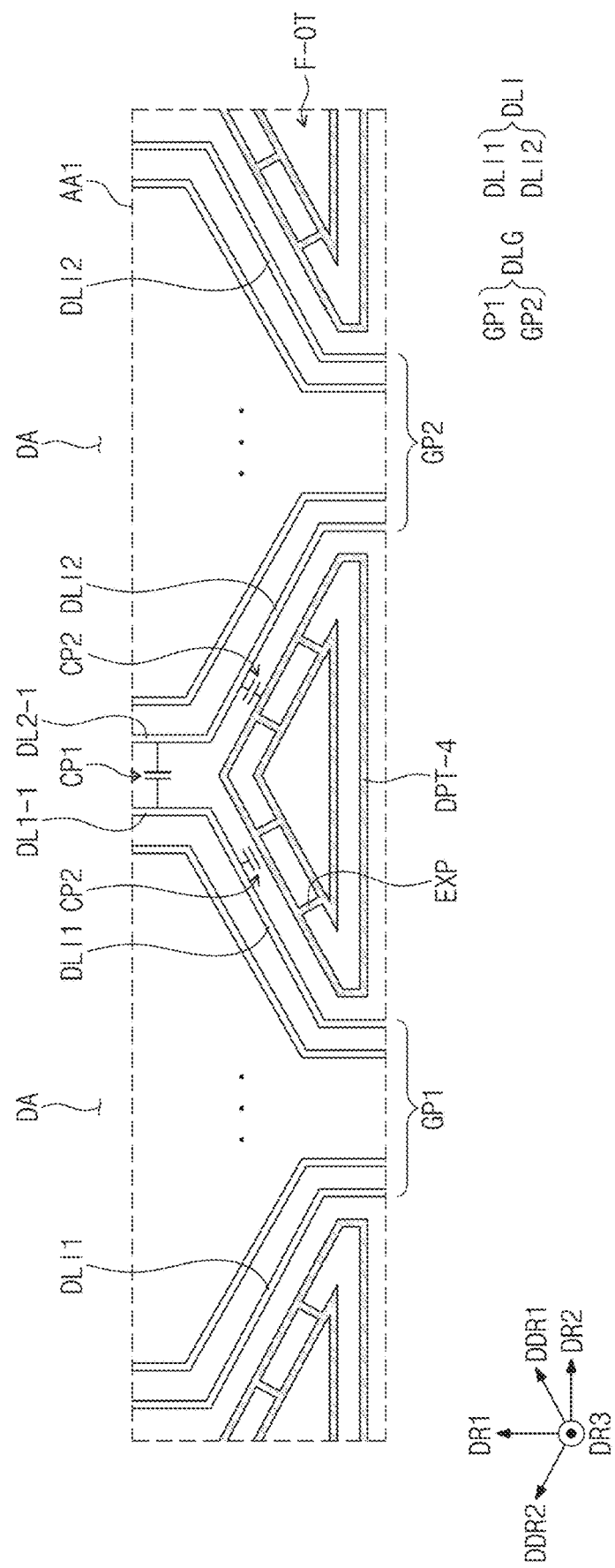

Referring to FIG. 17, in an alternative embodiment, the dummy patterns DPT-4 having a polygonal closed loop shape may be disposed between the first data line DL1-1 and the first second data line DL2-1. An area of the dummy patterns DPT-4 may be larger than that of the dummy patterns DPT shown in FIG. 7. In such an embodiment, because the capacity of the second parasitic capacitors CP2 increases, the generation of the static electricity may be further reduced, so that the burnt phenomenon BNT may be further prevented.

The invention should not be construed as being limited to the embodiments set forth herein. Rather, these embodiments are provided so that this disclosure will be thorough and complete and will fully convey the concept of the invention to those skilled in the art.

According to an embodiment of the disclosure, the first data line of the first data lines and the first second data line of the second data lines may be adjacent to each other. The dummy pattern may be disposed between the first data line and the first second data line. The parasitic capacitors may be formed by the dummy pattern and the first and first second data lines.

In an embodiment, the capacity of the parasitic capacitor formed between the first data line and the first second data line may be increased by the dummy pattern. In such an embodiment, where the capacitance of the parasitic capacitor increases, as the potential difference between the first and first second data lines is relatively reduced, the generation of the static electricity may be reduced. Accordingly, the burnt phenomenon may be prevented, and the damage to the components on the substrate may be prevented.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a first data line group disposed in a fan-out area and including a plurality of first data lines extending to a display area adjacent to the fan-out area;
a second data line group disposed in the fan-out area and including a plurality of second data lines extending to the display area adjacent to the fan-out area;
a plurality of pixels disposed in the display area and connected to the first and second data lines; and
a dummy pattern disposed in the fan-out area between the first data line group and the second data line group,
wherein the dummy pattern is in a floating state,
wherein the dummy pattern is provided in plurality, and
wherein each of a plurality of dummy patterns is integrally formed as a single unitary indivisible part.

2. The display device of claim 1, wherein
the first data lines extend radially in the fan-out area toward the display area, and
the second data lines extend radially in the fan-out area toward the display area.

3. The display device of claim 2, wherein each of the plurality of the dummy patterns has a hat shape.

4. The display device of claim 2, wherein the plurality of dummy patterns is disposed adjacent to a first first data line adjacent to the second data line group among the first data lines and adjacent to a first second data line adjacent to the first data line group among the second data lines.

5. The display device of claim 4, wherein the plurality of dummy patterns extends parallel to the first first data line and the first second data line.

6. The display device of claim 4, wherein each of the plurality of dummy patterns includes:
a first dummy line pattern adjacent to the first first data line and extending parallel to the first first data line; and
a second dummy line pattern adjacent to the first second data line and extending parallel to the first second data line, wherein the second dummy line pattern extends by being bent from a distal end of the first dummy line pattern adjacent to the display area.

7. The display device of claim 1, further comprising:
a plurality of extensions extending from adjacent dummy patterns among the dummy patterns,
wherein the extensions are integrally formed with the adjacent dummy patterns.

8. The display device of claim 1, wherein the plurality of dummy patterns is insulated from surrounding conductors.

9. The display device of claim 1, wherein the plurality of dummy patterns is disposed in a same layer as the first and second data lines.

10. The display device of claim 9, further comprising:
a substrate; and
an insulating layer disposed on the substrate,
wherein
the plurality of dummy patterns and the first and second data lines are directly disposed on the substrate, and
the insulating layer is disposed on the plurality of dummy patterns and the first and second data lines.

11. The display device of claim 1, wherein the plurality of dummy patterns is disposed in a layer different from a layer in which the first and second data lines are disposed.

12. The display device of claim 11, further comprising:
a substrate; and
an insulating layer disposed on the substrate,
wherein
the plurality of dummy patterns is disposed directly on the substrate,
the insulating layer is disposed on the plurality of dummy patterns, and
the first and second data lines are disposed on the insulating layer.

13. The display device of claim 1, wherein each of the plurality of dummy patterns has a polygonal shape.

14. The display device of claim 1, wherein each of the plurality of dummy patterns has a mesh shape.

15. The display device of claim 1, wherein each of the plurality of dummy patterns has a polygonal closed loop shape.

16. A display device comprising:
a first data line group disposed in a fan-out area and including a plurality of first data lines extending to a display area adjacent to the fan-out area;
a second data line group disposed in the fan-out area and including a plurality of second data lines extending to the display area adjacent to the fan-out area;
a plurality of pixels disposed in the display area and connected to the first and second data lines; and
a dummy pattern disposed in the fan-out area between the first data line group and the second data line group,
wherein the dummy pattern extends parallel to a first first data line adjacent to the second data line group among the first data lines and adjacent to a first second data line adjacent to the first data line group among the second data lines,
wherein the dummy pattern is provided in plurality, and wherein each of a plurality of dummy patterns is integrally formed as a single unitary indivisible part.

17. The display device of claim 16, wherein each of the plurality of dummy patterns includes:
a first dummy line pattern adjacent to the first first data line and extending parallel to the first first data line; and
a second dummy line pattern adjacent to the first second data line and extending parallel to the first second data line, wherein the second dummy line pattern extends by being bent from a distal end of the first dummy line pattern adjacent to the display area.

18. An electronic device comprising a display device, wherein the display device comprises:
a first data line group disposed in a fan-out area and including a plurality of first data lines extending to a display area adjacent to the fan-out area;
a second data line group disposed in the fan-out area and including a plurality of second data lines extending to the display area adjacent to the fan-out area;
a plurality of pixels disposed in the display area and connected to the first and second data lines; and
a dummy pattern disposed in the fan-out area between the first data line group and the second data line group, wherein
the dummy pattern is insulated from surrounding conductors, and no voltage is applied to the dummy pattern,
wherein the dummy pattern is provided in plurality, and
wherein each of a plurality of dummy patterns is integrally formed as a single unitary indivisible part.

* * * * *